United States Patent
Vishkasougheh et al.

(10) Patent No.: US 12,207,446 B2
(45) Date of Patent: Jan. 21, 2025

(54) ADJUSTABLE RETENTION DEVICE FOR HEAT SINK ASSEMBLY

(71) Applicant: INTERNATIONAL BUSINESS MACHINES CORPORATION

(72) Inventors: Mehdi Hamid Vishkasougheh, Rochester, MN (US); Kevin O'Connell, Rochester, MN (US); Eric J. Campbell, Rochester, MN (US); Arshad Alfoqaha, Eden Prairie, MN (US); Connor L. Smith, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 283 days.

(21) Appl. No.: 17/816,767

(22) Filed: Aug. 2, 2022

(65) Prior Publication Data

US 2024/0049432 A1 Feb. 8, 2024

(51) Int. Cl.
*H05K 7/20* (2006.01)
*H01L 23/40* (2006.01)

(52) U.S. Cl.
CPC ........ *H05K 7/2049* (2013.01); *H01L 23/4093* (2013.01)

(58) Field of Classification Search
CPC ............. H01L 23/4093; H01L 23/4006; H01L 2023/4075–4087; H05K 7/20136; H05K 7/20154; H05K 7/2039; H05K 7/20409; H05K 7/20436; H05K 7/20445; H05K 7/20454; H05K 7/2049; H05K 2201/06; H05K 2201/10; H05K 2201/10431;

(Continued)

(56) References Cited

U.S. PATENT DOCUMENTS 5,573,463 A * 11/1996 Arlt .................. F16D 3/76 464/147
5,678,627 A    10/1997 Lee (Continued)

FOREIGN PATENT DOCUMENTS

| CN | 101801167 A | 8/2010 |
| CN | 102947933 A | 2/2013 |
| JP | 2005150192 A | 6/2005 |

OTHER PUBLICATIONS

PCT/EP2023/070143 International Search Report and Written Opinion, mailed Sep. 25, 2023, 12 pgs.

(Continued)

*Primary Examiner* — Zachary Pape
*Assistant Examiner* — Steven Ngo
(74) *Attorney, Agent, or Firm* — Kimberly Zillig

(57) ABSTRACT

A heat sink retention device for retaining a heat sink, including a spring, proximate an electronic device in a circuit board. The device includes a first component configured to be attached to a circuit board, and a second component configured to be adjustably attached to the first component, and including an opening configured to retain a portion of a spring of a heat sink. When the first and second components are attached together and the first component is attached to the circuit board, the heat sink retention device is adapted to allow application of a force on the spring in order to retain the heat sink proximate an electronic device mounted on the circuit board.

20 Claims, 5 Drawing Sheets

(58) Field of Classification Search
CPC .......... H05K 2201/10439; H05K 2201/10507;
H05K 2201/10598; H05K 2201/10606
See application file for complete search history.

(56) References Cited

U.S. PATENT DOCUMENTS

| | | | | |
|---|---|---|---|---|
| 5,738,531 | A * | 4/1998 | Beaman | H01L 23/49827 439/71 |
| 5,774,335 | A | 6/1998 | Pare | |
| 5,825,622 | A | 10/1998 | Rife | |
| 6,229,703 | B1 | 5/2001 | Lee | |
| 6,373,704 | B1 | 4/2002 | Chen | |
| 6,450,248 | B1 | 9/2002 | Chang | |
| 6,654,254 | B2 * | 11/2003 | Szu | H01L 23/4093 24/458 |
| 6,724,632 | B2 | 4/2004 | Lee | |
| 6,822,869 | B2 * | 11/2004 | Huang | H01L 23/4093 165/185 |
| 7,072,183 | B2 | 7/2006 | Lee | |
| 7,743,817 | B2 | 6/2010 | Lin | |
| 8,139,361 | B2 * | 3/2012 | Hager | H05K 7/12 174/262 |
| 2002/0118513 | A1 * | 8/2002 | Koseki | H01L 23/4093 361/709 |
| 2004/0085735 | A1 * | 5/2004 | Liu | H01L 23/4006 257/E23.084 |
| 2004/0207076 | A1 | 10/2004 | Arrigotti | |
| 2005/0126753 | A1 * | 6/2005 | Lee | H01L 23/4093 165/80.3 |
| 2005/0219824 | A1 * | 10/2005 | Lee | H01L 23/4093 361/709 |
| 2006/0171129 | A1 * | 8/2006 | Berto | H01L 23/4006 257/E23.084 |
| 2007/0172371 | A1 * | 7/2007 | Podmore | F04C 2/1075 418/48 |
| 2010/0172102 | A1 | 7/2010 | Sass | |
| 2010/0271784 | A1 | 10/2010 | Yang | |
| 2013/0094149 | A1 | 4/2013 | Kataoka | |
| 2015/0208495 | A1 * | 7/2015 | Ma | H01L 23/4093 248/509 |
| 2019/0090344 | A1 * | 3/2019 | Faneuf | H05K 3/22 |
| 2020/0312744 | A1 * | 10/2020 | Sin Yan Too | H01L 23/40 |

OTHER PUBLICATIONS

TW Application Serial No. 112115451 Office Action, mailed Feb. 2, 2024, 6 pgs.

* cited by examiner

ADJUSTABLE RETENTION DEVICE FOR HEAT SINK ASSEMBLY

BACKGROUND

The present disclosure relates generally to heat sink assemblies, and more particularly to an adjustable retention device for retaining a heat sink, which can be spring loaded, to an electronic device in a printed circuit board (PCB).

Electronic devices, such as microprocessors and integrated circuits (ICs), must operate within certain specified temperature ranges to perform efficiently. Excessive heat degrades electronic device performance, reliability, life expectancy, and can even cause failure. Heat sinks are widely used for controlling excessive heat. A heat sink placed in thermal contact with an electronic device transfers heat from the electronic device through conduction.

SUMMARY

According to some embodiments of the disclosure, there is provided a heat sink retention device for retaining a heat sink, including a spring, proximate an electronic device in a circuit board. The heat sink retention device includes a first component configured to be attached to a circuit board, and a second component configured to be adjustably attached to the first component, and including an opening configured to retain a portion of a spring of a heat sink. When the first and second components are attached together and the first component is attached to the circuit board, the heat sink retention device is adapted to allow application of a force on the spring in order to retain the heat sink proximate an electronic device mounted on the circuit board.

According to some embodiments of the disclosure, there is provided a heat sink assembly for retaining a heat sink, including a spring, proximate an electronic device in a circuit board. The heat sink assembly includes a circuit board, an electronic device mounted on the circuit board, a heat sink, including a spring, proximate the electronic device mounted in the circuit board, and a heat sink retention device. The heat sink retention device includes a first component configured to be attached to a circuit board, and a second component configured to be adjustably attached to the first component, and including an opening configured to retain a portion of a spring of a heat sink. When the first and second components are attached together and the first component is attached to the circuit board, the heat sink retention device is adapted to allow application of a force on the spring in order to retain the heat sink proximate an electronic device mounted on the circuit board.

According to some embodiments of the disclosure, there is provided a method of retaining a heat sink including a spring proximate an electronic device in a circuit board. The method includes some operations of: providing a circuit board with an electronic device mounted thereon, providing a heat sink including a spring, and providing a heat sink retention device. The heat sink retention device includes a first component configured to be attached to a circuit board, and a second component configured to be adjustably attached to the first component, and including an opening configured to retain a portion of a spring of a heat sink. When the first and second components are attached together and the first component is attached to the circuit board, the heat sink retention device is adapted to allow application of a force on the spring in order to retain the heat sink proximate an electronic device mounted on the circuit board. The method further includes operations of: mounting the first component of the heat sink retention device on the circuit board, adjusting the second component of heat sink retention device relative to the first component such that the first and second components are attached in order to allow a portion of the spring to be in the opening in the second component, placing the portion of the spring in the opening in the second component, and locking the first and second components together in order to retain the end portion of the spring and apply the force to the spring to retain the heat sink proximate the electronic device.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
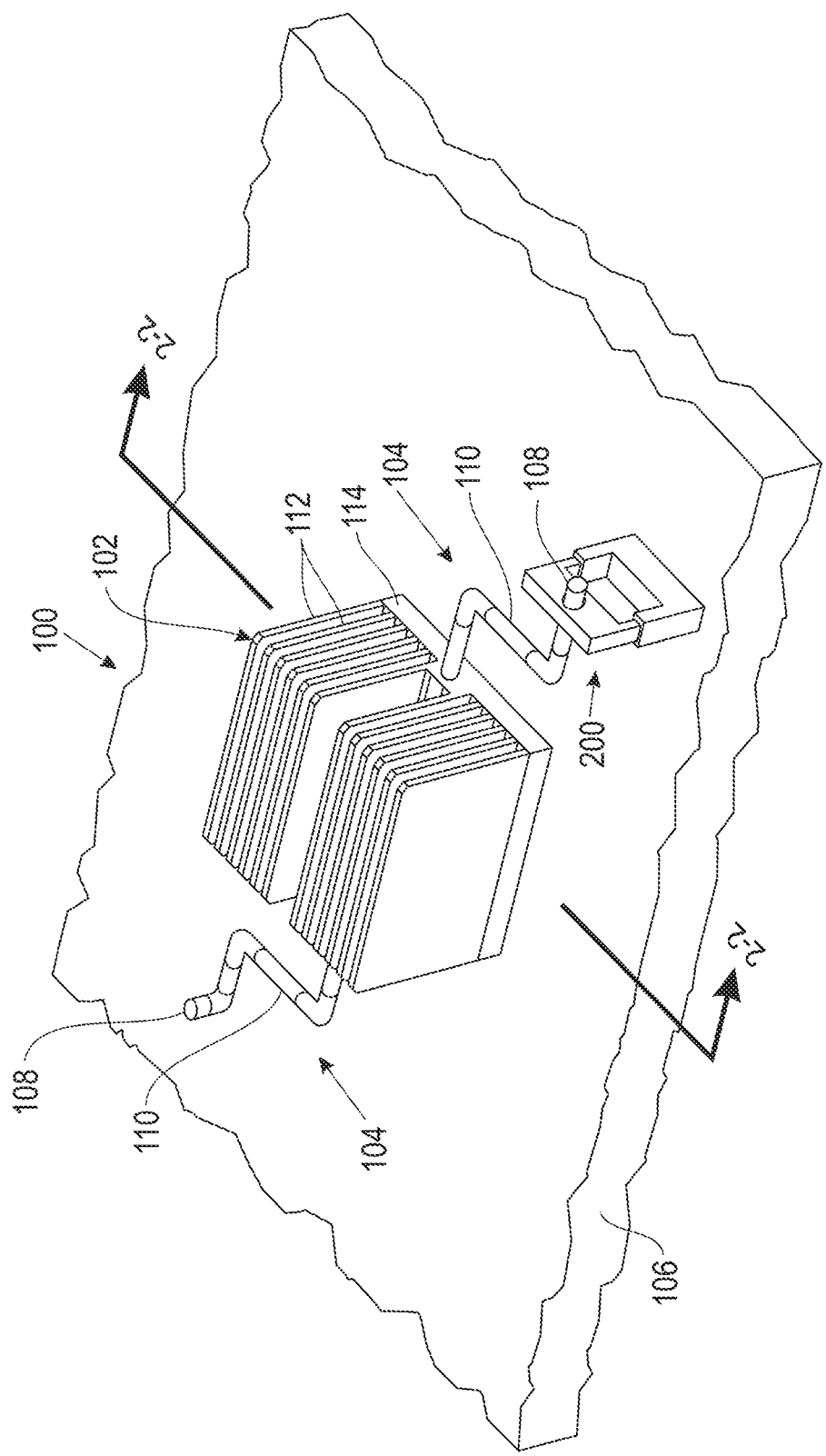
FIG. 1 is a schematic, perspective view of a heat assembly, in accordance with an illustrative embodiment of the disclosure.

While the disclosure is amenable to various modifications and alternative forms, specifics thereof have been shown by way of example in the drawings and will be described in detail. It should be understood, however, that the intention is not to limit the disclosure to the particular embodiments described. On the contrary, the intention is to cover all modifications, equivalents, and alternatives falling within the spirit and scope of the disclosure.

DETAILED DESCRIPTION

Aspects of the present disclosure relate generally to heat sink assemblies, and more particularly to an adjustable retention device for retaining a heat sink, which can be spring loaded, to an electronic device in a printed circuit board (PCB). While the present disclosure is not necessarily limited to such applications, various aspects of the disclosure can be appreciated through a discussion of various examples using this context.

Heat sinks are a vital part of any computer system. The heat generated by continued and extended use of a computer can cause damage to the electronic components in the computer. Heat sinks provide a way for the heat to be transferred away from a source and away from critical components. Heat sinks can be attached to electronic components or devices that generate heat in order to dissipate heat away from the device. To increase an amount of thermal transfer, heat sinks typically include a large surface area or a large number of thermally conductive fins that are in contact with a surrounding (cooling) medium, such as air. Heat sinks can get large and heavy. Such heat sinks can be susceptible to tilting during installation, which can apply an unbalanced load to a module or chip located below one of the heat sinks, which can lead to damage to the module or chip.

Heat sinks are commonly used for heat dissipation for application-specific integrated circuit (ASIC) chips, peripheral component interconnected express (PCIe) modules, and other integrated circuits (ICs). There is significant effort made in design and modeling to ensure that applied loads from the heat sinks are sufficient for compressing a thermal interlayer material (TIM) to a chip or module that is located on a PCB. Torsion spring loaded heat sinks utilize a torsion spring in order to compress the heat sink to the heat-generating electronic device.

Embodiments described in the disclosure provide adjustable retention devices that can exert force on springs of a spring-retained heat sink, for example, in order to secure the heat sink to an electronic device in a PCB. The adjustable retention devices can include a two-piece or a three-piece setup, for example, which can be used to retain springs of different sizes, etc. The adjustable retention device can also more generally be used to retain other heat sinks of any suitable kind, including those that include springs or torsion springs, for example.

One feature or advantage of the disclosed structures is the adjustable nature of the adjustable retention device for spring loaded heat sinks, which provides flexibility by having the potential to be applied on springs having different sizes and arm lengths. An ability to adjust the height of the adjustable retention device is a cost improvement mechanism by allowing such a setup to be applied to a broader range of springs with different diameters and height. Another feature or advantage is that the adjustable nature of the adjustable retention device can prevent potential pre-deformation on the torsion spring during an installation process. A further feature or advantage is that an elastomeric layer on the adjustable retention device provides a damping effect to shock and vibration possibly experienced by the heat sink assembly. Also, the elastomeric layer can prevent potential damage to the torsion spring or the adjustable retention device.

Turning to the figures, FIG. 1 depicts one example of a torsion spring-retained heat sink installed as part of a heat assembly 100, in accordance with an embodiment of the disclosure. As is illustrated, a torsion spring-retained heat sink 102 is secured atop a device (not visible in figure), such as an electronic device, mechanical device, chip, module, or the like, by using a torsion spring 104 to secure the heat sink 102 to a printed circuit board (PCB) 106 using an adjustable retention clip 200 that is attached to the PCB 106. In accordance with the illustrative embodiment, a hook end 108 of the torsion spring 104 can be secured in the adjustable retention clip (or device) 200 as shown. The adjustable retention clip 200 can exert force on the hook end 108 and an arm section 110 of the torsion spring 104, which can secure the heat sink 102 to the electronic device (not visible) on the PCB 106. The heat sink assembly 100 shown is one example that can be used with the adjustable retention clip 200, or other embodiments of the adjustable retention clip, of the disclosure. Other suitable heat assemblies are also contemplated.

For the sake of brevity, conventional techniques related to semiconductor device and IC fabrication may or may not be described in detail herein. Moreover, the various tasks and process steps or operations described herein can be incorporated into a more comprehensive procedure or process having additional operations or functionality not described in detail herein. In particular, various operations in the manufacture of semiconductor devices and semiconductor-based ICs are well known and so, in the interest of brevity, many conventional operations will only be mentioned briefly herein or will be omitted entirely without providing the well-known process details.

For purposes of description herein, the terms "upper," "lower,", "left" "rear," "right," "front," "vertical," "horizontal," and derivatives thereof shall relate to a heat sink 100 assembly as oriented in FIG. 1. However, it is to be understood that the heat sink assemblies that can be used with the adjustable retention clips 200, 300 (FIGS. 3-4) of the present disclosure can assume various alternative orientations and step sequences, except where expressly specified to the contrary. It is also to be understood that the specific devices and processes illustrated in the attached drawings, and described in the following disclosure, are simply exemplary embodiments of the inventive concepts defined in the appended claims. Hence, other physical characteristics relating to the embodiments disclosed herein are not to be considered as limiting, unless the claims expressly state otherwise.

Figure 2:
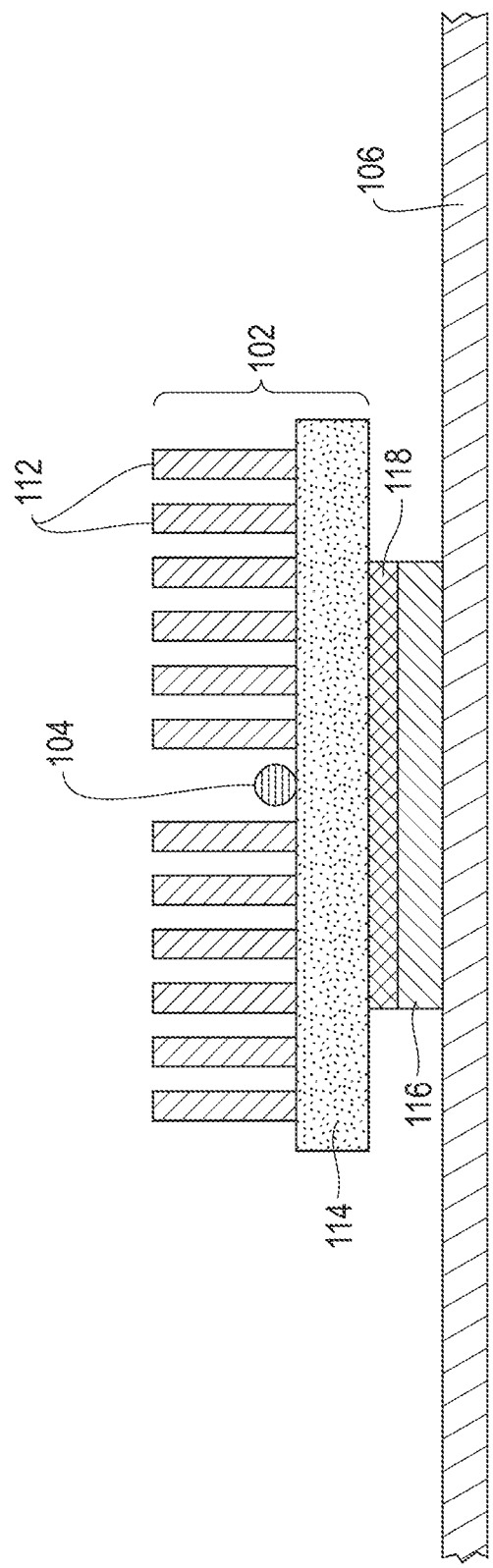
FIG. 2 is a cross-sectional view of the heat assembly of FIG. 1 taken at 2-2, in accordance with an illustrative embodiment of the disclosure.

FIG. 2 is a cross-sectional view of the heat assembly 100 of FIG. 1 taken at 2-2, in accordance with an embodiment of the disclosure. The figure illustrates the heat sink 102, which includes a plurality of fins 112 and a base 114, that is compressed by the torsion spring 104 onto an electronic device 116. The heat sink 102 can be located vertically above the electronic device 116 and can serve to dissipate heat from the electronic device 116. A layer of a thermal interlayer material 118 can be compressed between the base 114 of the heat sink 102 and the electronic device 116 as shown. The electronic device 116 is located vertically above, and is connected to, the PCB 106.

Figure 3:
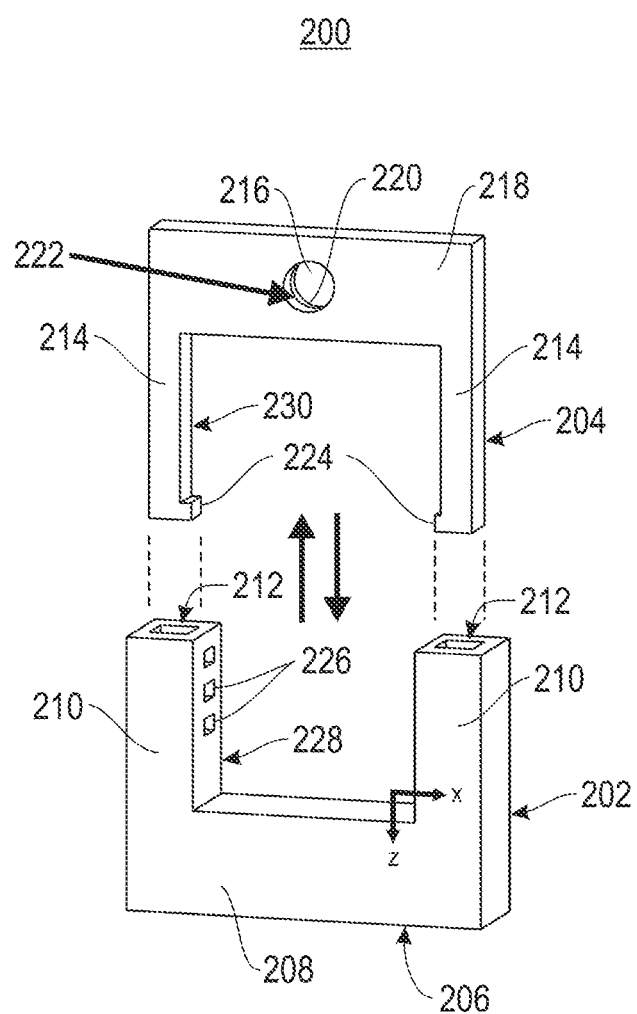
FIG. 3 is a schematic, perspective view of the adjustable retention device shown in FIG. 1, in accordance with an illustrative embodiment of the disclosure.

FIG. 3 is a schematic, perspective view of an adjustable retention clip 200, in accordance with an embodiment of the disclosure. The adjustable retention clip 200 is also shown included in the embodiment of the heat sink assembly 100 in FIG. 1.

The adjustable retention clip 200 shown includes two (2) parts, or components, which are adjustable with respect to each other and can lock into each other as indicated by the dashed lines in the figure. The adjustable retention clip 200 includes two u-shaped components, which include a u-shaped base component 202 and a u-shaped insertion component 204. The u-shaped base component 202 includes a center or base portion 208 that connects first and second legs 210. The center portion 208 can be attached to a PCB (e.g., 106 in FIG. 1) at a bottom surface 206. The u-shaped base component 202 can be attached to a PCB, for example, by solder or by a press fit method. Other suitable methods of attachment of the u-shaped base component 202 to a PCB are also contemplated. The u-shaped base component 202 can include first and second openings or lumens 212 in the first and second legs 210, and the openings or lumens 212 can accommodate or receive portions of the u-shaped insertion component 204.

As shown by the arrows in FIG. 3, first and second legs 214 of the u-shaped insertion component 204 can be slidably inserted into and removed from the openings or lumens 212 in the u-shaped base component 202. The u-shaped insertion component 204 includes a cutout opening 216 in a center portion 218. The cutout opening 216 can have a cylindrical shape and can accommodate one of the hook ends 108 of the torsion spring 104, as shown in FIG. 1, in order to hold the heat sink 102 in place. The cutout opening 216 can include a layer 220 of elastomeric material on its inner wall 222. The elastomeric material layer 220 can provide a damping effect to shock and vibration, which can be experienced by the torsion springs 104 (see FIG. 1) during shipping, etc., of the heat sink assembly 100, in order to reduce potential for damage.

The u-shaped base component 202 can include a plurality of openings 226 along an inner surface 228 of the first and second legs 210. The u-shaped insertion component 204 can include a tab 224 along an inner surface 230 of each leg 214 that can lock or fit into the openings 226 located at different positions along the u-shaped base component 202. The plurality of openings 226 are shown included on an inner surface 228 of the u-shaped base component 202, although other locations are also contemplated. The plurality of openings 226 contribute to the adjustability of the adjustable retention clip 200. Once both components 202, 204 are locked together, if a change in position of the u-shaped insertion component 204 is desired, the legs 214 of the u-shaped insertion component 204 can be pushed outward in order to remove the tabs 224 from a set of openings 226 included in the plurality of openings 226.

Figure 4:
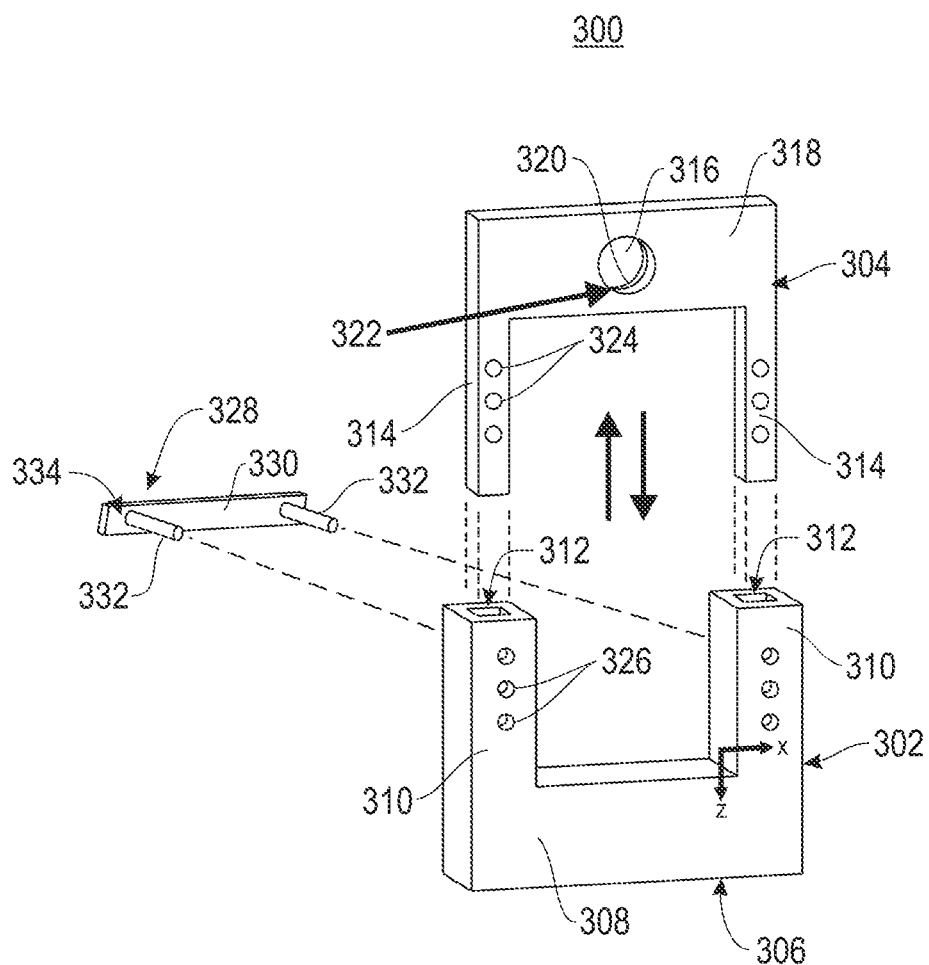
FIG. 4 is a schematic, perspective view of an adjustable retention device for heat sink assemblies, in accordance with an illustrative embodiment of the disclosure.

FIG. 4 is a schematic, perspective view of an adjustable retention clip 300, in accordance with an embodiment of the disclosure. The adjustable retention clip 300 shown includes three (3) parts or components that can lock together. The adjustable retention clip 300 includes two u-shaped components, which include a u-shaped base component 302 and a u-shaped insertion component 304. The u-shaped base component 302 includes a center or base portion 308 that connects first and second legs 310. The center portion 308 can be attached to a PCB (e.g., 106 in FIG. 1) at a bottom surface 306. The u-shaped base component 302 can be attached to a PCB, for example, by solder or by a press fit method. Other suitable methods of attachment of the u-shaped base component 302 to a PCB are also contemplated. The u-shaped base component 302 can include first and second openings or lumens 312 in the first and second legs 310, and the openings or lumens 312 can accommodate or receive portions of the u-shaped insertion component 304.

As shown by the dashed lines in FIG. 4, first and second legs 314 of the u-shaped insertion component 304 can be slidably inserted into and removed from the openings or lumens 312 in the u-shaped base component 302. The u-shaped insertion component 304 includes a cutout opening 316 in a center portion 318. The cutout opening 316 can have a cylindrical shape and can accommodate one of the hook ends 108 of one of the torsion springs 104, as shown in FIG. 1, in order to hold the heat assembly 100 in place. The cutout opening 316 can include a layer 320 of elastomeric material on its inner wall 322. The elastomeric material layer 320 can provide a damping effect to shock and vibration, which can be experienced by the torsion springs 104 (see FIG. 1) during shipping, etc., of the heat sink assembly 100, in order to reduce potential for damage.

The u-shaped insertion component 304 includes a plurality of cylindrically-shaped openings 324 located along the first and second legs 314 that contribute to the adjustability of the adjustable retention clip 300. The u-shaped base component 302 also includes cylindrically-shaped openings 326 along the first and second legs 310. A third component of the adjustable retention clip 300 is a pin-fit component 328 that can hold the u-shaped base component 302 and the u-shaped insertion component 304 together using a pin-fit style locking technique. Two (2) leg openings 326 on the u-shaped base component 302 and two (2) leg openings 324 on the u-shaped insertion component 304 can be aligned at a desired position or height to effectively hold torsion springs 104 in heat sink assembly 100 (as in FIG. 1) in a desired position and to exert load on the heat sink 102 and hold it in place. The pin-fit component 328 can then be inserted through the two u-shaped components 302, 304 in order to hold the two u-shaped components 302, 304 together in the desired position or height.

The pin-fit component 328 can have a central planar portion 330 that includes first and second pins 332 that extend in the same direction from a planar surface 334 on the central planar portion 330. The pins 332 are cylindrically-shaped and sized to fit through the cylindrically-shaped openings 324, 326 through both u-shaped components 302, 304. Although a cylindrical shape of the openings 324, 326 and the pins 332 is shown in the figures, other suitable shapes and arrangements are also contemplated by the disclosure.

Figure 5:
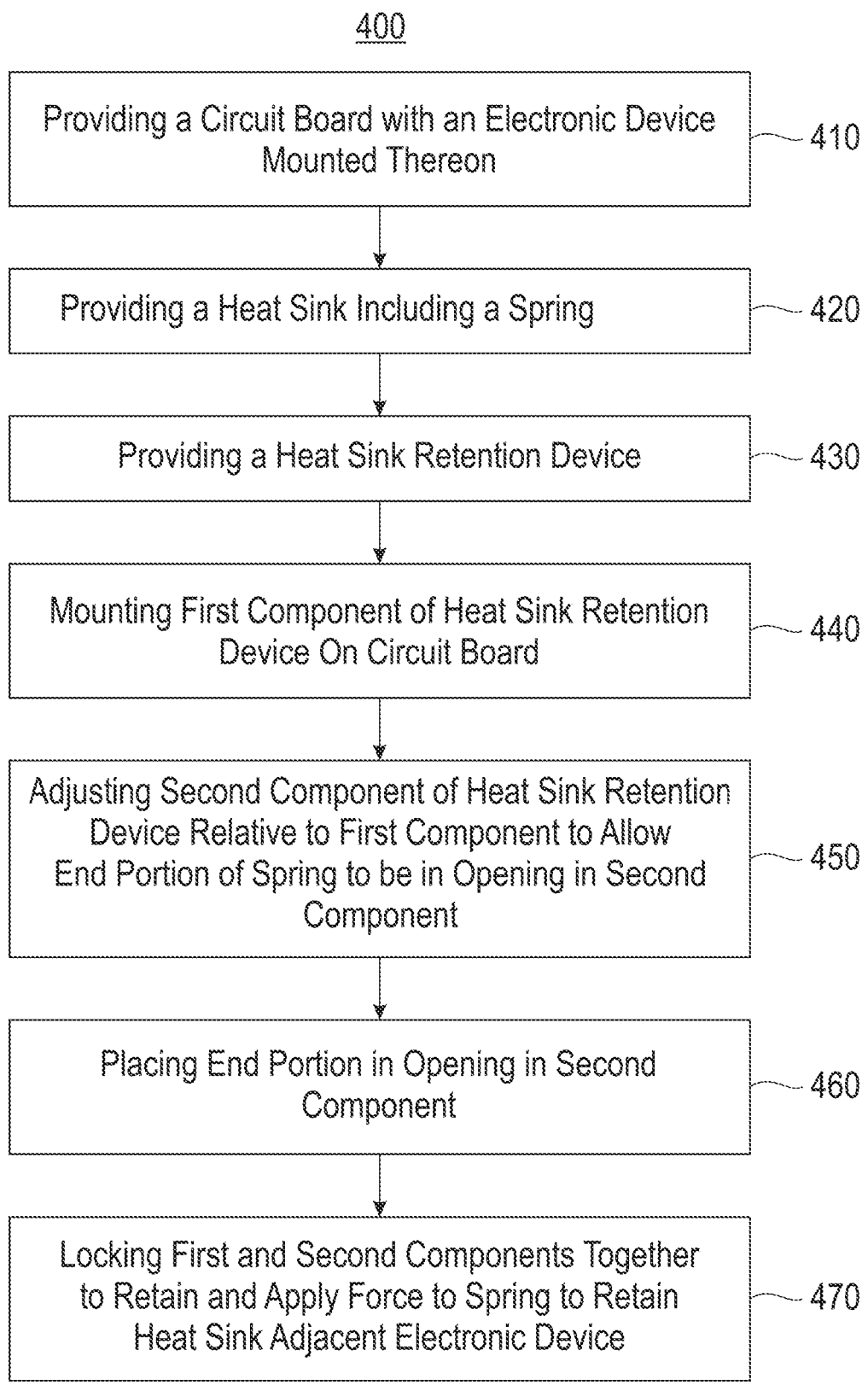
FIG. 5 is a flow chart of a method of retaining a heat sink including a spring proximate an electronic device on a circuit board, in accordance with an illustrative embodiment of the disclosure.

FIG. 5 is a method 400 of retaining a heat sink 102 (referring to FIG. 1) including a torsion spring 104 proximate an electronic device 116 (FIG. 2) on a circuit board 106 (FIG. 1), in accordance with an embodiment of the disclosure. An operation 410 of the method 400 is providing a circuit board 106 with an electronic device 116 mounted thereon. Another operation 420 is providing a heat sink 102 including a torsion spring 104. A further operation 430 is providing an adjustable retention clip or device 200 or 300 (in FIGS. 3, 4).

The adjustable retention device or clip 200 (for example, in FIGS. 1, 3) can comprise a first component 202 configured to be attached to the circuit board 106, and a second component 204 configured to be adjustably attached to the first component 202, and including an opening 216 configured to retain a portion of the torsion spring 104 (FIG. 1) of the heat sink 102. The first and second components 202, 204 are attached together and the first component 202 is attached to the circuit board 106, the adjustable retention clip 200 is adapted to allow application of a force on the torsion spring 104 in order to retain the heat sink 102 proximate the electronic device 116 mounted on the circuit board 106.

Yet another operation 440 of the method 400 is mounting the first component 202 of the adjustable retention clip 200 on the circuit board 106. Another operation 450 is adjusting the second component 204 of adjustable retention clip 200 relative to the first component 202 such that the first and second components 202, 204 are attached in order to allow a portion of the torsion spring 104 to be in the opening 216 in the second component. The method 400 also includes an operation 460 of placing the end portion 108 of the torsion spring 104 in the opening 216 in the second component 204. A further operation 470 is locking the first and second components 202, 204 together in order to retain the end portion 108 of the torsion spring 104 and apply the force to the torsion spring 104 to retain the heat sink 102 proximate the electronic device 116.

If a three-component adjustable retention device is used, such as adjustable retention clip 300 shown in FIG. 4, another operation in the method can be performed. For example, a third component 328 can lock the first and the second components 302, 304 together in order to attach the first and second components 302, 304.

For purposes of this description, certain aspects, advantages, and novel features of the embodiments of this disclosure are described herein. The disclosed processes, and systems should not be construed as being limiting in any way. Instead, the present disclosure is directed toward all novel and nonobvious features and aspects of the various disclosed embodiments, alone and in various combinations and sub-combinations with one another. The processes, and systems are not limited to any specific aspect or feature or combination thereof, nor do the disclosed embodiments require that any one or more specific advantages be present, or problems be solved.

Although the operations of some of the disclosed embodiments are described in a particular, sequential order for convenient presentation, it should be understood that this manner of description encompasses rearrangement, unless a particular ordering is required by specific language set forth below. For example, operations described sequentially can in some cases be rearranged or performed concurrently. Moreover, for the sake of simplicity, the attached figures may not show the various ways in which the disclosed processes can be used in conjunction with other processes. Additionally, the description sometimes uses terms like "provide" or "achieve" to describe the disclosed processes. These terms are high-level abstractions of the actual operations that are performed. The actual operations that correspond to these terms can vary depending on the particular implementation and are readily discernible by one of ordinary skill in the art.

As used in this application and in the claims, the singular forms "a," "an," and "the" include the plural forms unless the context clearly dictates otherwise. Additionally, the term "includes" means "comprises."

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A heat sink retention device for retaining a heat sink, including a spring, proximate an electronic device in a circuit board, the heat sink retention device comprising:
   a first component configured to be attached to the circuit board; and
   a second component configured to be adjustably attached to the first component, and including an opening configured to retain a portion of the spring of the heat sink, and at least one leg that is adapted to allow each of the at least one leg to be slidably inserted into at least one lumen in the first component and lock into place in order to adjustably attach the first and the second components together,
   wherein when the first and second components are attached together and the first component is attached to the circuit board, the heat sink retention device is adapted to allow application of a force on the spring in order to retain the heat sink proximate an electronic device mounted on the circuit board.

2. The device of claim 1, wherein the second component moves relative to the first component in order to be adjusted to apply the force to the spring and retain the heat sink.

3. The device of claim 2, wherein the second component locks into the first component in order to attach the first and the second components together.

4. The device of claim 1, further comprising:
   a third component that locks the first and the second components together in order to attach the first and the second components.

5. The device of claim 1, wherein the second component is u-shaped and includes the at least one leg including a first leg and a second leg that are adapted to allow the first and the second legs to be slidably inserted into the at least one lumen including a first lumen and a second lumen, respectively, in the first component and lock into place in order to adjustably attach the first and the second components together.

6. The device of claim 5, wherein the first and the second legs of the second component each include a tab that can be locked into one of a plurality of openings at different locations along the first and the second lumens of the first component to allow for adjustable attachment, wherein the plurality of openings are configured to fit the tabs.

7. The device of claim 5, wherein the first and the second legs of the second component each include a first plurality of openings at different locations along the first and the second legs, and the first and the second lumens of the first component each include a second plurality of openings at different locations along the first and the second lumens, and the heat sink retention device further comprises:
   a third component including a first pin and a second pin extending therefrom and configured to extend through two of the openings of the second plurality of openings on the first component and a corresponding two of the openings of the first plurality of openings on the second component, wherein the third component is adapted to allow for attachment of the first and the second components together.

8. The device of claim 1, wherein the opening includes an elastomeric coating adapted to allow a damping effect to shock and vibration experienced by the spring of the heat sink.

9. A heat sink assembly for retaining a heat sink, including a heat sink retention device, including a spring, proximate an electronic device in a circuit board, the heat sink assembly comprising:
   the circuit board;
   the electronic device mounted on the circuit board;
   the heat sink, including the spring, proximate the electronic device mounted in the circuit board; and
   the heat sink retention device comprising:
      a first component configured to be attached to the circuit board; and
      a second component configured to be adjustably attached to the first component, and including an opening configured to retain a portion of the spring of the heat sink, and at least one leg that is adapted to allow the at least one leg to be slidably inserted into at least one lumen in the first component and lock into place in order to adjustably attach the first and the second components together,
   wherein when the first and the second components are attached together and the first component is attached to the circuit board, the heat sink retention device is adapted to allow application of a force on the spring in order to retain the heat sink proximate the electronic device mounted on the circuit board.

10. The heat sink assembly of claim 9, wherein the second component moves relative to the first component in order to be adjusted to apply the force to the spring and retain the heat sink.

11. The heat sink assembly of claim 10, wherein the second component locks into the first component in order to attach the first and the second components together.

12. The heat sink assembly of claim 9, wherein the heat sink retention device further comprises:
a third component that locks the first and the second components together in order to attach the first and the second components.

13. The heat sink assembly of claim 9, wherein the second component is u-shaped and the at least one leg includes a first leg and a second leg that are adapted to allow the first and the second legs to be slidably inserted into at least one lumen including a first lumen and a second lumen, respectively, in the first component and lock into place in order to adjustably attach the first and the second components together.

14. The heat sink assembly of claim 13, wherein the first and the second legs of the second component each include a tab that can be locked into one of a plurality of openings at different locations along the first and the second lumens of the first component to allow for adjustable attachment, wherein the plurality of openings are configured to fit the tabs.

15. The heat sink assembly of claim 13, wherein the first and the second legs of the second component each include a first plurality of openings at different locations along the first and the second legs, and the first and the second lumens of the first component each includes a second plurality of openings at different locations along the first and the second lumens, and the heat sink retention device further comprises:
a third component including a first pin and a second pin extending therefrom and configured to extend through two of the openings of the second plurality of openings on the first component and a corresponding two of the openings of the first plurality of openings on the second component, wherein the third component is adapted to allow for attachment of the first and the second components together.

16. The heat sink assembly of claim 9, wherein the opening includes an elastomeric coating adapted to allow a damping effect to shock and vibration experienced by the spring of the heat sink.

17. The heat sink assembly of claim 9, further comprising:
a thermal interlayer material located between the heat sink and the electronic device.

18. A method of retaining a heat sink including a spring proximate an electronic device in a circuit board, the method comprising:
providing the circuit board with the electronic device mounted thereon;
providing the heat sink including the spring;
providing a heat sink retention device comprising:
a first component configured to be attached to the circuit board; and
a second component configured to be adjustably attached to the first component, and including an opening configured to retain a portion of the spring of the heat sink, and at least one leg that is adapted to allow the at least one leg to be slidably inserted into at least one lumen in the first component and lock into place in order to adjustably attach the first and the second components together,
wherein when the first and the second components are attached together and the first component is attached to the circuit board, the heat sink retention device is adapted to allow application of a force on the spring in order to retain the heat sink proximate the electronic device mounted on the circuit board;
mounting the first component of the heat sink retention device on the circuit board;
adjusting the second component of the heat sink retention device relative to the first component such that the first and the second components are attached in order to allow the portion of the spring to be in the opening in the second component;
placing the portion of the spring in the opening in the second component; and
locking the first and the second components together in order to retain the portion of the spring and apply the force to the spring to retain the heat sink proximate the electronic device.

19. The method of claim 18, wherein the second component moves relative to the first component in order to be adjusted to apply the force to the spring and retain the heat sink.

20. The method of claim 18, wherein the heat sink retention device further comprises:
a third component that locks the first and the second components together in order to attach the first and the second components.

* * * * *